United States Patent [19]
Farooq et al.

[11] Patent Number: 5,912,044
[45] Date of Patent: Jun. 15, 1999

[54] METHOD FOR FORMING THIN FILM CAPACITORS

[75] Inventors: Mukta Shaji Farooq, Hopewell Junction; Ajay P. Giri, Poughkeepsie, both of N.Y.; Rajesh Shankerial Patel, Fremont, Calif.

[73] Assignee: International Business Machines Corporation, Armonk, N.Y.

[21] Appl. No.: 08/782,205

[22] Filed: Jan. 10, 1997

[51] Int. Cl.⁶ ..................................................... B05D 5/12
[52] U.S. Cl. .............................. 427/79; 427/80; 427/125; 427/97; 427/534; 427/555; 29/25.42; 438/381; 438/387; 438/396; 438/706
[58] Field of Search .................................. 427/79–80, 81, 427/96, 97, 125, 126.3, 226, 534, 554, 555, 556; 361/306.1, 306.3, 314, 321; 29/25.42; 438/381, 387, 396, 706, 712

[56] References Cited

U.S. PATENT DOCUMENTS

| | | | |
|---|---|---|---|
| 5,027,253 | 6/1991 | Lauffer et al. | 361/321 |
| 5,323,520 | 6/1994 | Peters et al. | 29/25.42 |
| 5,406,446 | 4/1995 | Peters et al. | 361/306.1 |
| 5,406,447 | 4/1995 | Miyazaki | 301/313 |
| 5,459,635 | 10/1995 | Tomozawa et al. | 361/321.5 |
| 5,479,316 | 12/1995 | Smrtic et al. | 361/322 |
| 5,527,729 | 6/1996 | Matsumoto et al. | 437/60 |
| 5,653,841 | 8/1997 | Krishnamurthy et al. | 156/150 |
| 5,756,395 | 5/1998 | Rostoker et al. | 438/622 |

OTHER PUBLICATIONS

"Integrated, Low Inductance, Small Area Capacitors for VLSI Semiconductor Packages," *IBM Technical Disclosure Bulletin*, vol. 25, No. 2, Jul. 1982, pp. 883–888.

"Directly Attached Decoupling Capacitors and Fabrication Process," *IBM Technical Disclosure Bulletin*, vol. 32, No. 6B, Nov. 1989, pp. 330–331.

*Primary Examiner*—Brian K. Talbot
*Attorney, Agent, or Firm*—Ira D. Blecker

[57] ABSTRACT

Thin film capacitors are formed by a multi-level dry processing method that includes simultaneous ablation of via openings through both the dielectric and the metal electrode layers of a capacitor. Preferably, the dielectric films are formed of barium strontium titanate and the metal electrode layers are formed of platinum. The present invention overcomes the problems associated with the use of strong etchants to sequentially form separate via openings through the electrode and dielectric layers, prevents the potential for delamination of the respective layers during wet etching and the possible undesirable effects of etching solutions on substrate materials.

15 Claims, 4 Drawing Sheets

METHOD FOR FORMING THIN FILM CAPACITORS

BACKGROUND OF THE INVENTION

This invention relates generally to a method for forming thin film capacitors, and more particularly to such a method that includes forming the capacitors by multi-level dry processing techniques.

Integrated, low inductance capacitors are essential to the operation of high performance, very large scale integrated (VLSI) semiconductor packages. The integrated capacitors are typically part of a multi-layered ceramic (MLC) power stabilizing interposer structure containing through vias. In particular, high performance single chip module (SCM) and multi-chip module (MCM) packages need discrete capacitors in the nanofarad range which are typically placed very close to silicon chip microprocessors. Signal propagation characteristics of these packages can be further enhanced by placing thin film capacitors directly under the chip. This arrangement requires that the thin film capacitors be fabricated on the top side of an interposer substrate. For high permittivity, materials such as barium strontium titanate (BST) are typically used as dielectric materials, with platinum commonly used as a conductive metal, and barrier layers formed of metal nitrides The top surface metallurgy (TSM) i.e., the exterior interconnect features, are typically formed of conductive metals such as chromium, copper, nickel, gold, and alloys of such materials. Often, the top surface metallurgy is arranged to enable the C-4 (Controlled Collapse Chip Connection) solder joining of chips to the interposer.

In the fabrication of thin film capacitors, various layers of the structure must be patterned separately in a sequential manner. The number of photo-patterning steps needed for processing such devices depends on the number of layers required in the end structure or device. Conventional etching processes use photo resist patterns and different etchant baths, for example, aqua regia for platinum, hydrochloric acid for barium strontium titanate, and other strong acids for metal nitride barrier layers. Strong etchants adversely affect the bond between the resist material and the underlying layer, causing delamination during the etch process which, in turn, makes pattern delineation less precise and thus impacts the design, fidelity and quality of the manufactured structure. Also, the critical success of wet methods depends on the ability of specific etchants to only etch one layer without affecting the other layers of the structure. Furthermore, handling of such chemicals in a manufacturing environment requires additional environmental controls and handling precautions. In addition, wet processing chemicals used for etching may have undesirable effects on substrates.

The present invention is directed to overcoming the problems set forth above. It is desirable to have a dry processing method for forming vias through thin film capacitors that does not require the use of wet etchant solutions and baths. It is also desirable to have such a method in which dry processes, such as ion beam etching laser beam etching, and reactive ion etching in an appropriate reactive atmosphere, can be used in a specific sequence to form vias in thin film capacitor structures.

BRIEF SUMMARY OF THE INVENTION

In accordance with one aspect of the present invention, a method for forming a thin film capacitor includes providing a ceramic substrate having electrically conductive vias provided in the substrate. A barrier layer of an electrically conductive material is deposited on the ceramic substrate and the vias, and a coating of an electrically conductive material is deposited over the barrier layer. The electrically conductive coating is patterned by removing selected areas of the coating and exposing the barrier layer in the preselected areas whereby the remaining platinum coating defines electrically conductive circuit features. A layer of dielectric material is deposited on the electrically conductive circuit features and on the exposed portions of the barrier layer. Preselected portions of the dielectric layer and the electrically conductive circuit features directly underlying the dielectric layer are simultaneously etched. Electrically conductive material is then deposited in the patterned portions of the dielectric layer and the electrically conductive circuit features, whereby the deposited electrically conductive material is in electrical communication with the electrically conductive vias disposed in the ceramic substrate.

Other features of the method for forming a thin film capacitor, in accordance with the present invention, include the electrically conductive coating being formed of platinum, and the dielectric layer being formed of barium strontium titanate. Still other features include the simultaneous ablation of preselected portions of the dielectric layer and the directly underlying electrically conductive circuit features be carried out by machining said portions with a laser beam or ion beam, or by reactive ion etching in an oxidizing atmosphere.

BRIEF DESCRIPTION OF THE SEVERAL VIEWS OF THE DRAWING

A more complete understanding of the structure and operation of the present invention may be had by reference to the following detailed description when taken in conjunction with the accompanying drawings, wherein.

DETAILED DESCRIPTION OF THE INVENTION

Figure 7:
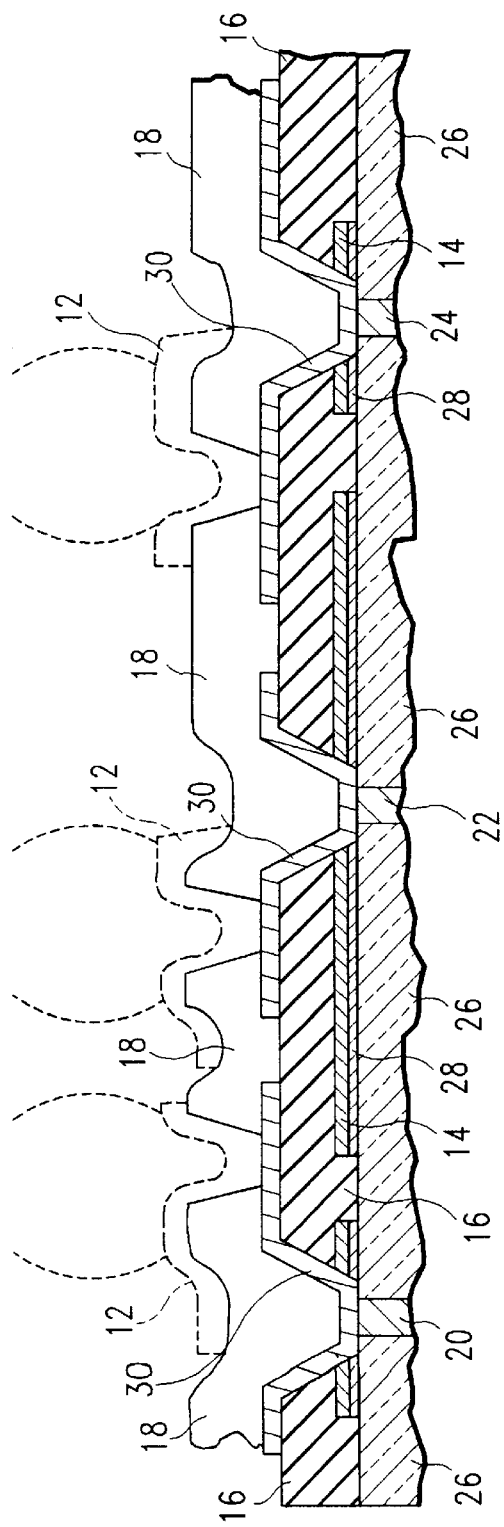
FIG. 7 is a sectional view of the top surface of a thin film capacitor constructed in accordance with the method embodying the present invention, showing the arrangement for attachment of other components to the capacitor.
Figure 8:
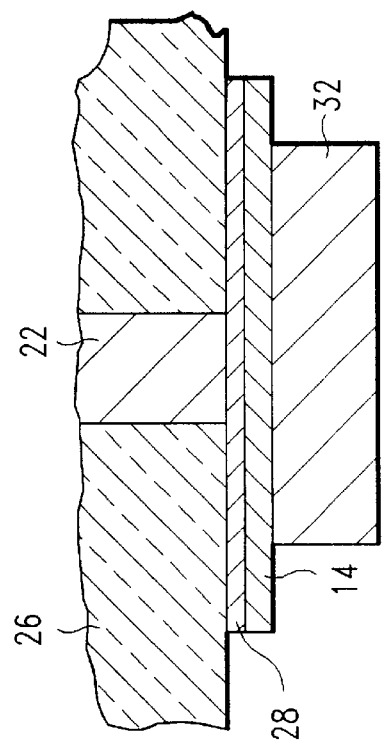
FIG. 8 is an enlarged sectional view of the bottom surface of a thin film capacitor constructed in accordance with the method embodying the present invention, showing the mounting areas provided for electrical connection of the capacitor to other components.

A thin film capacitor 10, constructed in accordance with the method embodying the present invention, is shown in somewhat schematic fashion in FIG. 7. The capacitor 10 is a parallel plate capacitor having a thin film segmented top electrode layer 12 and a segmented, complementary set of counter electrodes formed in a thin film layer 14. The top and bottom electrode layers 12, 14 are separated by a high permittivity dielectric layer 16 which serves as a spacer layer between the top and bottom electrode layers. The upper surface of the capacitor structure 10 is connected to the interface connections of chips which are, in turn, typically connected to a larger interconnection structure in an electronic system. The lower surface of the capacitor shown in FIG. 8, is typically connected to a substrate providing electrical connection between the capacitor and appropriate signal and ground circuits. For example, the electrical circuit passing through a via 20 disposed at the left side of FIG. 7, may be connected to a signal circuit, whereas the circuit passing through the center via 22 may be connected to a power circuit, and the circuit passing through the far right via 24 may be connected to a ground circuit. The top electrode layer 12 is typically covered by a dielectric layer 18, such as polyimide. Appropriate electrical connection is provided through the top dielectric layer 18 for the attachment of individual chips, integrated circuits or chip modules. A common attachment method is known as C-4 (Controlled Collapse Chip Connection), as shown in dashed lines in FIG. 7.

In carrying out the present invention, conventional fabrication processes are used in the initial formation of the capacitor 10. The vias, 20, 22, 24 extend through a multilayered ceramic (MLC) substrate 26 as illustrated in FIG. 2. The vias 20, 22, 24 are metallized, preferably with molybdenum. The MLC substrate 26 is finely polished at both the top and bottom surfaces of the vias. Thus, the top and bottom surfaces of the vias are disposed in coplanar relationship with the respective top and bottom surfaces of the substrate 26. The initial step of providing the substrate 26 with metallized vias 20, 22, 24 is represented by block 40 in FIG. 1.

An electrically conductive barrier layer 28, for example, a metal nitride such as a titanium nitride or a tantalum nitride, is deposited on the ceramic substrate 26 and the exposed end portions of the metallized vias 20, 22 24, to prevent effusion of volatile molybdenum oxides from the via surfaces during subsequent high temperature deposition and annealing of the dielectric layer 16. The barrier layer 28 typically may have a thickness of from about 500 Å to about 3000 Å. The deposition of the barrier layer 28 on the substrate 16 is represented by block 42 in FIG. 1.

Figure 1:
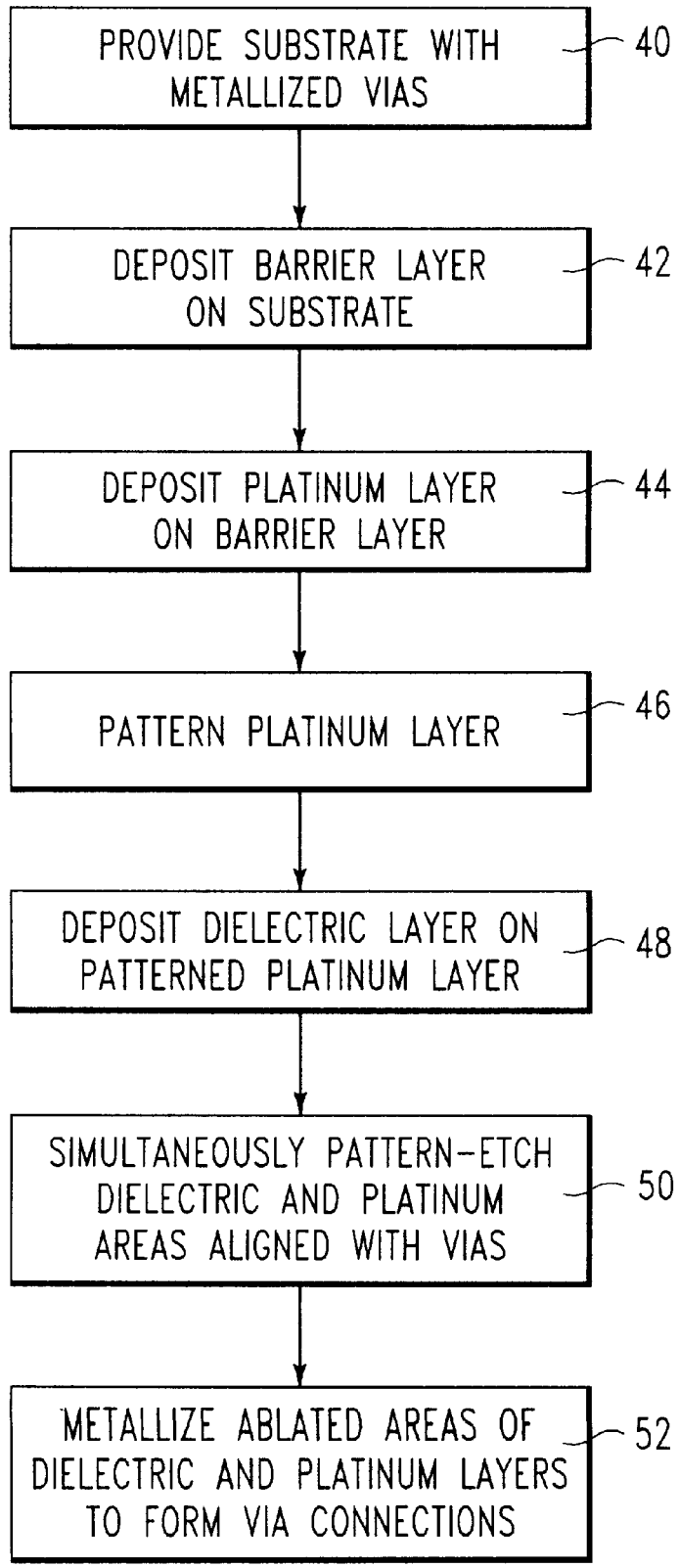
FIG. 1 is a flow chart showing the primary steps in the method for forming thin film capacitors in accordance with the present invention.
Figure 2:
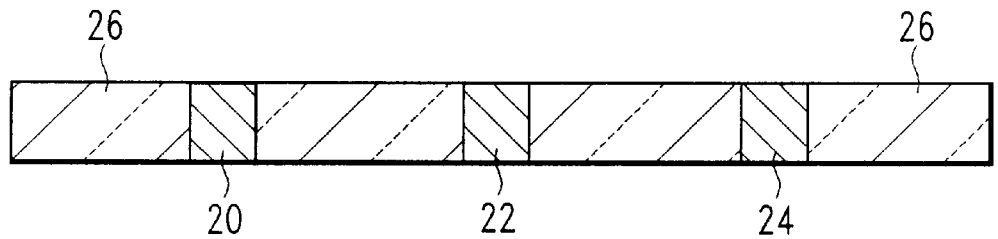
FIG. 2 is an enlarged sectional view of a ceramic substrate having metallized vias as provided in an initial step of the method for forming thin film capacitors in accordance with the present invention.
Figure 3:
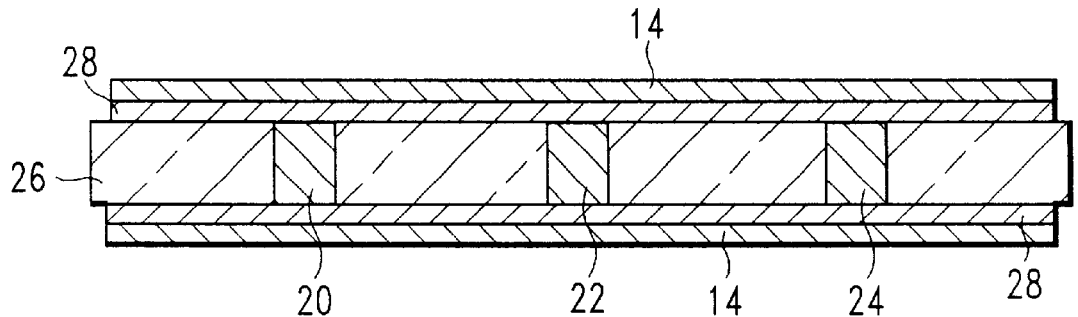
FIG. 3 is an enlarged sectional view of the ceramic substrate and metallized vias shown in FIG. 2, with barrier and electrode layers deposited on the substrate structure in accordance with the method embodying the present invention.

The bottom electrode layer 14 is then deposited over the barrier layer 28 by evaporation or sputtering, as represented by block 44 in FIG. 1, to form the intermediate structure shown in FIG. 3. Preferably, the bottom electrode layer 14 is provided by a coating of platinum which typically has a thickness of from about 500 Å to about 5000 Å. In forming interposer capacitors, a platinum electrode layer is typically formed on both the top and bottom surfaces of the ceramic substrate 26.

Figure 4:
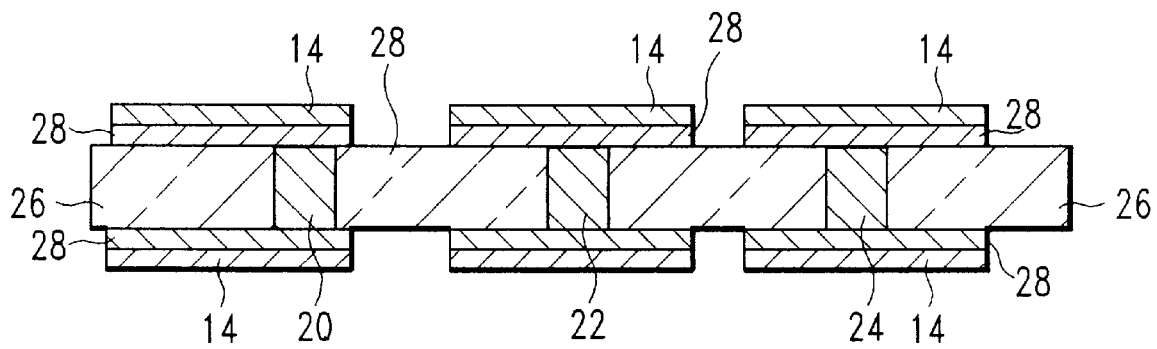
FIG. 4 is an enlarged sectional view of a thin film capacitor structure at an intermediate stage of construction in accordance with the method embodying the present invention, showing the structure after patterning of the barrier and electrode layers.

The barrier layer 28 may be patterned first, followed by patterning of the deposited platinum layer 14. Alternatively, both barrier and electrode layers 28, 14 may be patterned simultaneously in a single step, whereby the ceramic substrate 26 is exposed in areas from which the two layers are removed. After patterning, either in a single or two-step operation, the remaining barrier material 28 is disposed directly under the defined bottom electrodes 14 which define electrically conductive circuit features such as capacitor plates or other circuit elements, as shown in FIG. 4.

Patterning of the barrier and electrode layers 28, 14, indicated by block 46 in FIG. 1 may be carried out by conventional means, such as by application of a photoresist material over the two layers 28, 14. In the photoresist processes, photo lithographic techniques are used to expose selected portions of the photoresist material to light, typically through a glass mask. When using a positive photoresist, exposed portions are dissolved in a subsequent process step. This is followed by ion beam etching, whereby the platinum coating 14 and the barrier layer 28 are removed from the exposed regions. The unexposed portions of the photoresist material are then stripped from the thus-formed patterned platinum and barrier layers 14, 28 which now define electrically conductive circuit features. The unexposed photoresist material is preferably stripped by ion beam etching in an oxidizing atmosphere, for example, a blend of oxygen and argon. If desired, the etching of the platinum and barrier layers 14, 28 and subsequent stripping of the remaining photoresist may be carried out by other conventional means, such as reactive ion etching or use of suitable solvents. Typically, the platinum circuit layer 14 has a thickness of from about 500 Å to about 5000 Å.

Figure 5:
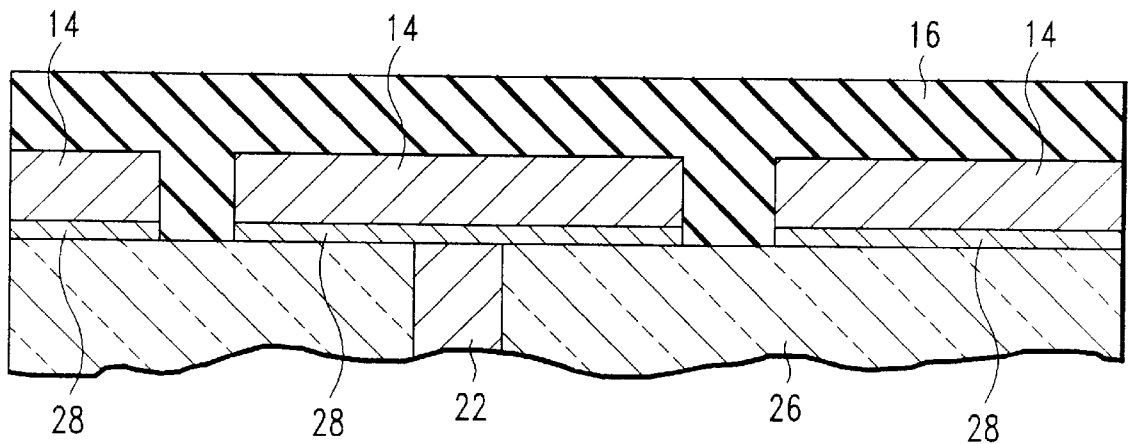
FIG. 5 is an enlarged view of the structure shown in FIG. 4, after deposition of a dielectric layer on the patterned barrier and electrode layers.

The dielectric layer 16 is then deposited over the patterned electrode layer 14, as indicated at block 48 in FIG. 1 and shown in FIG. 5. Preferably, for reasons explained below, the dielectric layer 16 is formed of barium strontium titanate ($BaSrTiO_3$, commonly referred to as BST) and typically has a thickness of from about 500 Å to about 5000 Å. Barium strontium titanate has high permittivity characteristics and is readily patterned by either a laser beam or ion beam or by reactive ion etching. The dielectric layer 16 may also be formed of materials of the $ABX_3$ family, where A is divalent, B is trivalent, and X is oxygen. Also, the dielectric layer 16 may be formed of electrically nonconductive oxides or nitrides, e.g. $SiO_2$, $Si_3N_4$, $Ta_2O_5$ or $Al_2O_3$. After deposition, the dielectric layer 16 is conventionally annealed in an appropriate atmosphere.

Importantly, preselected portions of the BST dielectric layer 16 and the directly underlying platinum electrode and barrier layers 14, 28, aligned with a respectively corresponding one of the vias 20, 22, 24 are then simultaneously patterned in a single step to form an opening through the layers that extends to the corresponding via. This step is represented by block 50 in FIG. 1 and, in accordance with the present invention, is carried out by a dry process using a high energy ion beam or a laser beam, or by reactive ion etching in an appropriate atmosphere. A laser beam, preferably provided by an excimer (308 nm) laser, or an ion beam, is particularly suitable for use in the simultaneous removal of the barium strontium titanate dielectric material, the platinum electrode material, and the metal nitride barrier material, in the selected areas. Ion beam milling and laser drilling, by respective ion beams and laser beams, are conventional methods of removing thin layers of material and, in carrying out the present invention with the dielectric layer 16 formed of barium strontium titanate, the electrode layer 14 formed of platinum, and the barrier layer 28 formed of a metal nitride, all layers may be simultaneously etched in a single operation. If using reactive ion etching to form the via openings, an appropriate photoresist is deposited on the surface of the BST dielectric layer 16, and preselected portions of the photoresist are exposed by directing light through a glass mask or other stencil to expose the preselected portions of the surface that overlie the vias 20, 22, 24. The surface is then etched and stripped in the manner described above with respect to patterning the platinum electrode layer 14.

Since the barrier layer 28 is formed of an electrically conductive material that has previously been patterned, it is generally not necessary to remove the barrier material at the bottom of the via openings, but may be removed in the course of forming the via openings through the dielectric and electrode layers 16, 14 without adversely affecting the performance of the capacitor 10.

Figure 6:
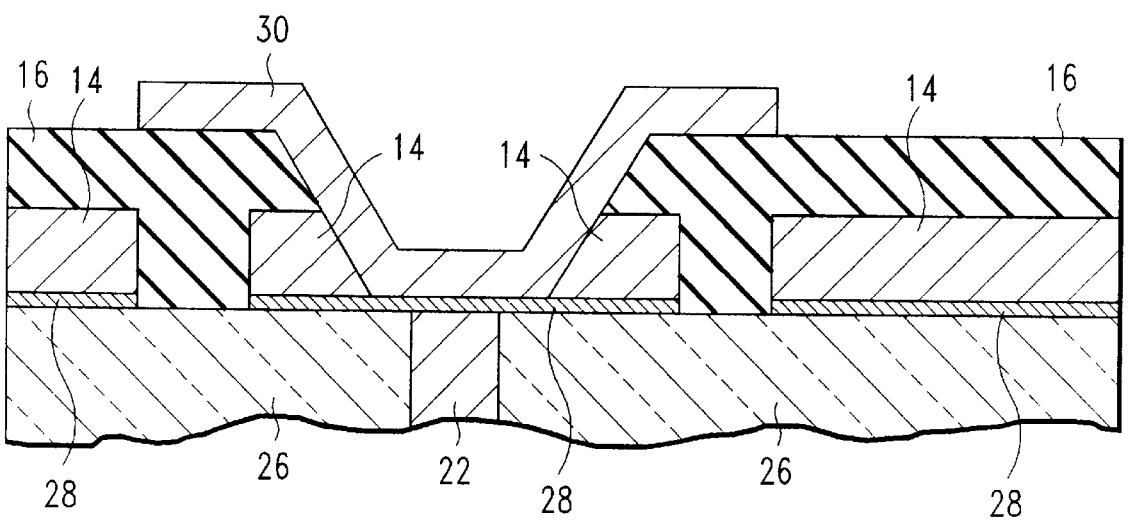
FIG. 6 is an enlarged sectional view of a thin film capacitor formed in accordance with the method embodying the present invention, showing the capacitor structure after formation of the top electrode metallurgy.

After laser, ion beam, or reactive ion etch of the dielectric layer 16, the underlying area of the platinum layer 14 and, if desired, the barrier layer 28 to simultaneously form a via opening through two or three layers in a single step, electrically conductive top electrode structures 30 are formed in the ablated via opening, as shown in FIG. 6 and represented by block 52 in FIG. 1. The top electrode structures 30 provide for subsequent electrical connection between a respective via 20, 22, 24 and the top surface metallurgy 12, or alternatively, provide sites for the subsequent direct attachment of single chips, multiple chip modules, integrated circuits, or other components. The top surface dielectric layer 18 is generally deposited over the top electrode layer 30, as shown in FIG. 7.

The top dielectric layer 18, preferably formed of a polyimide may then be deposited over the top electrode layer 30 and vias formed by using a laser to drill openings through the polyimide layer 18 to the platinum electrode surface. After cleanup of the drilled holes, the desired top surface metallurgy 12, shown in dashed lines in FIG. 7, may be deposited using conventional lift-off or evaporation through molybdenum mask processes.

Bottom surface metallurgy, such as mounting pads 32 adapted for C-4 joining with other components as shown in FIG. 8, may be advantageously formed on the lower surface of the capacitor 10. The bottom circuit features 32 may be conventionally formed by sequential deposition of copper, nickel and gold through a molybdenum mask and evaporation, or by plating successive layers of copper, nickel and gold by photoresist processes over a chromium or copper seed surface.

Thus, it can be seen that the processing methods and sequence for forming a thin film capacitor 10, and more particularly simultaneously forming vias through dielectric and electrode layers as described above, eliminates the use of harsh chemicals and the problems associated with such wet processes. Importantly, the method for forming thin film capacitors, in accordance with the present invention, obviates the necessity of finding a selective method to etch the dielectric layer while not etching the underlying metal layer. Also, the above-described multi-level dry process method reduces the number of steps required for fabrication of the capacitor. Furthermore, the methods described above can be extended to more than two layers, i.e., multiple layers of dielectric, conductive and barrier materials, such as barium strontium titanate, platinum and metal nitrides, can be simultaneously patterned using laser beam, ion beam, or reactive ion etching techniques.

Although the present invention is described in terms of a preferred exemplary embodiment, with specific key dielectric and metal film combinations, those skilled in the art will recognize that changes in those materials may be made without departing from the spirit of the invention. For example, different combinations of metals, metal alloys, and dielectric materials may be made without departing from the spirit of the invention. Such changes are intended to fall within the scope of the following claims. Other aspects, features, and advantages of the present invention may be obtained from a study of this disclosure and the drawings, along with the appended claims.

What is claimed is:

1. Method for forming a capacitor, comprising:
   providing a ceramic substrate having electrically conductive vias formed therein;
   depositing a barrier layer of an electrically conductive material on said ceramic substrate and exposed portions of said electrically conductive vias;
   depositing a coating of electrically conductive material on said barrier layer;
   patterning said electrically conductive coating and said barrier layer by removing preselected areas of said coating and said barrier layer and exposing said ceramic substrate in said preselected areas whereby the remaining electrically conductive coating and barrier layer defines electrical circuit features;
   depositing a layer of a dielectric material on the patterned electrically conductive circuit features and on the exposed portions of the ceramic substrate;
   simultaneously etching preselected portions of said layer of dielectric material and at least the electrically conductive coating of the electrically conductive circuit features underlying said preselected portions of the layer of dielectric material, said preselected portions being aligned with said electrically conductive vias; and
   depositing an electrically conductive material on said etched portions of the layer of dielectric material and the electrically conductive circuit features, whereby said deposited electrically conductive material is in electrical communication with said electrically conductive vias.

2. A method for forming a capacitor, as set forth in claim 1, wherein said simultaneously etching preselected portions of said layer of dielectric material and at least the electrically conductive coating of the underlying electrically conductive circuit features includes machining said preselected portions with a laser beam.

3. A method for forming a capacitor, as set forth in claim 1, wherein said simultaneously etching preselected portions of said layer of dielectric material and at least the electrically conductive coating of the underlying electrically conductive circuit features includes machining said preselected portions with an ion beam.

4. A method for forming a capacitor, as set forth in claim 1, wherein said simultaneously etching preselected portions of said layer of dielectric material and at least the electrically conductive coating of the underlying electrically conductive circuit features includes removing said preselected portions by reactive ion etching in an oxidizing atmosphere.

5. A method for forming a capacitor, as set forth in claim 1, wherein said depositing a layer of a dielectric material on the patterned electrically conductive circuit features includes depositing a layer of barium strontium titanate on said patterned electrical circuit features.

6. A method for forming a capacitor, as set forth in claim 1, wherein said depositing a coating of electrically conductive material on said barrier layer includes depositing a coating of platinum on said barrier layer.

7. A method for forming a capacitor, comprising:

providing a ceramic substrate having vias formed therein, said vias being substantially filled with molybdenum;

depositing a barrier layer of an electrically conductive material on said substrate including said molybdenum-filled vias;

depositing a coating of platinum on said barrier layer;

patterning said platinum coating and said barrier layer by removing preselected areas of said platinum coating and said barrier layer and exposing said ceramic substrate in said preselected areas whereby the remaining platinum coating and barrier layer defines electrically conductive circuit features;

depositing a layer of barium strontium titanate on the circuit features and exposed portions of the ceramic substrate;

simultaneously etching preselected portions of said layer of barium strontium titanate and at least the platinum coating of the circuit features underlying said preselected portions of the layer of barium strontium titanate, said preselected portions being aligned with said molybdenum-filled vias in the substrate; and depositing an electrically conductive material on said etched portions of the layer of barium strontium titanate and the circuit features, whereby said deposited electrically conductive material is in electrical communication with said molybdenum-filled vias.

8. A method for forming a capacitor, as set forth in claim 7, wherein said ceramic substrate has substantially planar top and bottom surfaces, and said molybdenum-filled vias have top and bottom surfaces disposed in respective coplanar relationship with the top and bottom surfaces of the ceramic substrate, and said depositing a barrier layer of an electrically conductive material on said substrate including said molybdenum-filled vias, includes depositing said barrier layer on both the top and bottom planar surfaces of the substrate and the top and bottom surfaces of the molybdenum-filled vias.

9. A method for forming a capacitor, as set forth in claim 7, wherein said ceramic substrate has substantially planar top and bottom surfaces and said molybdenum-filled vias have top and bottom surfaces disposed in respective coplanar relationship with the top and bottom surfaces of the ceramic substrate, and said depositing a barrier layer on selected external surfaces of the substrate includes depositing a coating of an electrically conductive metal nitride having a thickness of from about 500 Å to about 3000 Å on said top and bottom surfaces of the substrate and the molybdenum-filled vias.

10. A method for forming a capacitor, as set forth in claim 7, wherein said patterning the platinum coating and barrier layer includes:

applying a photoresist over said platinum coating;

exposing preselected portions of the photoresist to light;

removing the exposed portions of the photoresist;

removing the platinum coating and barrier layer underlying the removed exposed portions of the photoresist, and stripping the unexposed portions of the photoresist from the electrically conductive circuit features.

11. A method for forming a capacitor, as set forth in claim 10, wherein removing the exposed portions of photoresist material includes dissolving said exposed portions, and stripping the unexposed portions of the photoresist material includes removing said unexposed photoresist material by reactive ion etching.

12. A method for forming a capacitor, as set forth in claim 10, wherein removing the exposed portions of photoresist material includes dissolving said exposed portions, and stripping the unexposed portions of the photoresist material includes removing the unexposed portions of the photoresist material with a solvent.

13. A method for forming a capacitor, as set forth in claim 7, wherein said simultaneously etching preselected portions of said layer of barium strontium titanate and at least the platinum coating of the circuit features underlying said preselected portions of the layer of barium strontium titanate includes removing said preselected portions of the barium strontium titanate and underlying portions of at least the platinum coating of the circuit features by machining said preselected portions with a laser beam.

14. A method for forming a capacitor, as set forth in claim 7, wherein etching preselected portions of said layer of barium strontium titanate and at least the platinum coating of the circuit features underlying said preselected portions of the layer of barium strontium titanate includes removing said preselected portions of the barium strontium titanate and underlying portions of at least the platinum coating of the circuit features by etching said preselected portions with a ion beam.

15. A method for forming a capacitor, as set forth in claim 7, wherein etching preselected portions of said layer of barium strontium titanate and at least the platinum coating of the circuit features underlying said preselected portions of the layer of barium strontium titanate includes removing said preselected portions by reactive ion etching in an oxidizing atmosphere.

* * * * *